United States Patent [19]

White

[11] Patent Number: 5,175,626
[45] Date of Patent: Dec. 29, 1992

[54] APPARATUS PROVIDING A CLOCK SIGNAL FOR A DIGITAL TELEVISION RECEIVER IN RESPONSE TO A CHANNEL CHANGE

[75] Inventor: Hugh E. White, Pennington, N.J.

[73] Assignee: RCA Thomson Licensing Corporation, Princeton, N.J.

[21] Appl. No.: 735,750

[22] Filed: Jul. 25, 1991

[51] Int. Cl.⁵ .............................................. H04N 5/44
[52] U.S. Cl. ................................... 358/191.1; 358/11; 358/142; 358/188
[58] Field of Search .................. 358/188, 191.1, 193.1, 358/195.1, 11, 12, 141, 142, 140; 455/179, 182, 183, 184, 192, 199

[56] References Cited

U.S. PATENT DOCUMENTS

| | | | |
|---|---|---|---|
| 4,535,352 | 8/1985 | Haskell | 358/11 |
| 4,622,578 | 11/1986 | Rzeszewski | 358/12 |
| 4,633,293 | 12/1986 | Powers | 358/140 |
| 4,980,767 | 12/1990 | Chao | 358/905 |

OTHER PUBLICATIONS

Semicompatible High Definition Television Using Field Differential Signals, by Barry G. Haskell, IEEE Transactions on Communications, vol. COM-34, No. 10, Oct. 1986 pp. 1030 to 1037.

Primary Examiner—Tommy P. Chin
Attorney, Agent, or Firm—Joseph S. Tripoli; Eric P. Herrmann; Ronald H. Kurdyla

[57] ABSTRACT

A high definition television receiver including digital signal processing circuits receives a high definition television signal containing narrowband high priority information from which a system clock is derived, and low priority wideband information. After a channel change, a clock signal developed from narrowband information associated with the previously tuned channel is used as the receiver clock until a clock signal with a desired phase characteristic is developed from the narrowband information of the newly tuned channel.

13 Claims, 2 Drawing Sheets

APPARATUS PROVIDING A CLOCK SIGNAL FOR A DIGITAL TELEVISION RECEIVER IN RESPONSE TO A CHANNEL CHANGE

FIELD OF THE INVENTION

This invention concerns apparatus for generating a clock signal to be used by digital signal processing circuits in a television receiver. In particular, this invention concerns apparatus for developing a clock signal after a channel change so as to permit video information associated with a new channel to be displayed almost immediately after the channel change.

BACKGROUND OF THE INVENTION

An important performance feature of a television receiver system is an ability to display a picture almost immediately after a system perturbation such as a channel change. In the case of a television receiver including digital signal processing circuits, the first of many events that must occur to produce a picture display is the development of an appropriate clock timing signal for use by the digital signal processing circuits.

One particularly advantageous digital signal transmitting/receiving system for a high definition television (HDTV) signal is described in my copending U.S. patent application Ser. No. 650,329 titled "Modulator/Demodulator for Compatible High Definition Television System", filed Feb. 4, 1991. In that system, transmitted high definition television information is divided into high priority information that is intended to be received with high reliability, and low priority information. The high priority information and the low priority information are conveyed as separate QAM (quadrature amplitude modulated) carrier signals within different portions of the television signal frequency spectrum. The high priority information exhibits a small excess bandwidth, and a narrower bandwidth and significantly larger amplitude than the low priority information.

At a receiver, a clock signal for use by associated digital signal processing networks is developed from the high priority narrowband signal by means of a nonlinear signal generator and a phase locked loop responsive to the output signal from the nonlinear signal generator. Since the nonlinear signal generator operates on a narrowband QAM signal with small excess bandwidth, the magnitude of the output signal from the nonlinear generator is small. This dictates the use of a narrowband phase locked loop, which exhibits an undesirably slow response time. Signal energy to assist in developing the clock signal can be added to the television signal in the form of a pilot signal, but the energy associated with such an added signal may degrade the television signal by introducing interference and unwanted artifacts. In any case, in a system of this type it is desirable to provide a clock signal almost immediately after a channel change because viewers typically prefer seeing a displayed image for the new channel almost immediately after a channel change. The present invention addresses this matter.

SUMMARY OF THE INVENTION

Apparatus in accordance with the principles of the present invention is included in a digital HDTV receiver that processes narrow band high priority information and low priority wide band information. In response to a system perturbation such as a channel change, a clock signal developed from narrowband information of the previously tuned channel is used as the clock signal for the new channel until an appropriately phased new clock signal can be developed from the narrowband information of the new channel.

In an illustrated embodiment of the invention, the digital television receiver includes a so-called fractionally spaced amplitude and phase adaptive equalizer. When a channel change is initiated, a clock signal developed from the old channel is used as the clock signal for the new channel until a control network together with a phase locked loop produces a phase stable new clock signal at the phase of the old clock signal. Variations of the clock signal phase for a period of time following the channel change are avoided, and the receiver functions normally immediately after a channel change.

DETAILED DESCRIPTION

Figure 1:
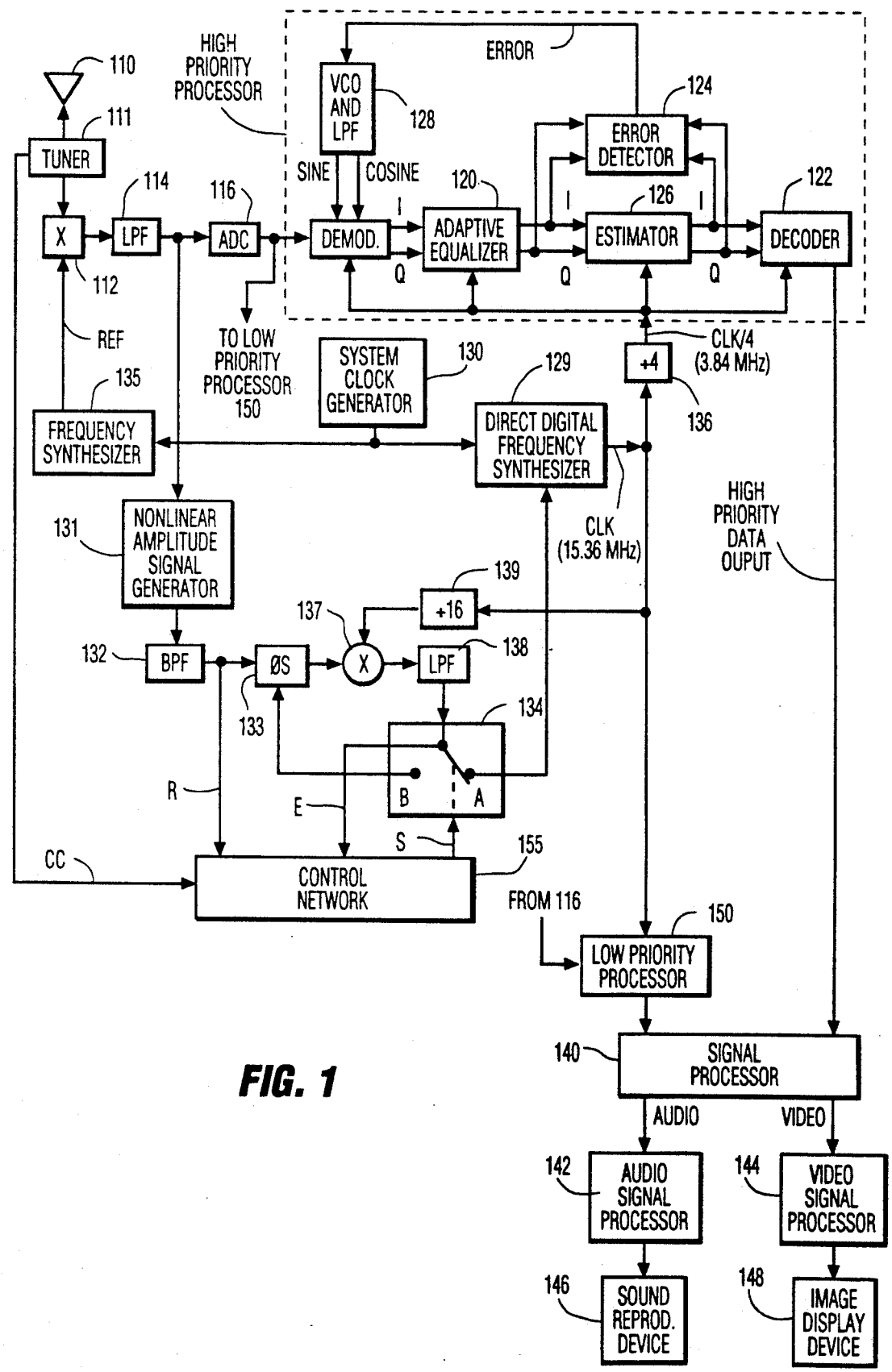
FIG. 1 is a block diagram of a portion of a digital television receiver including digital signal processing networks and apparatus according to the present invention.
Figure 2:
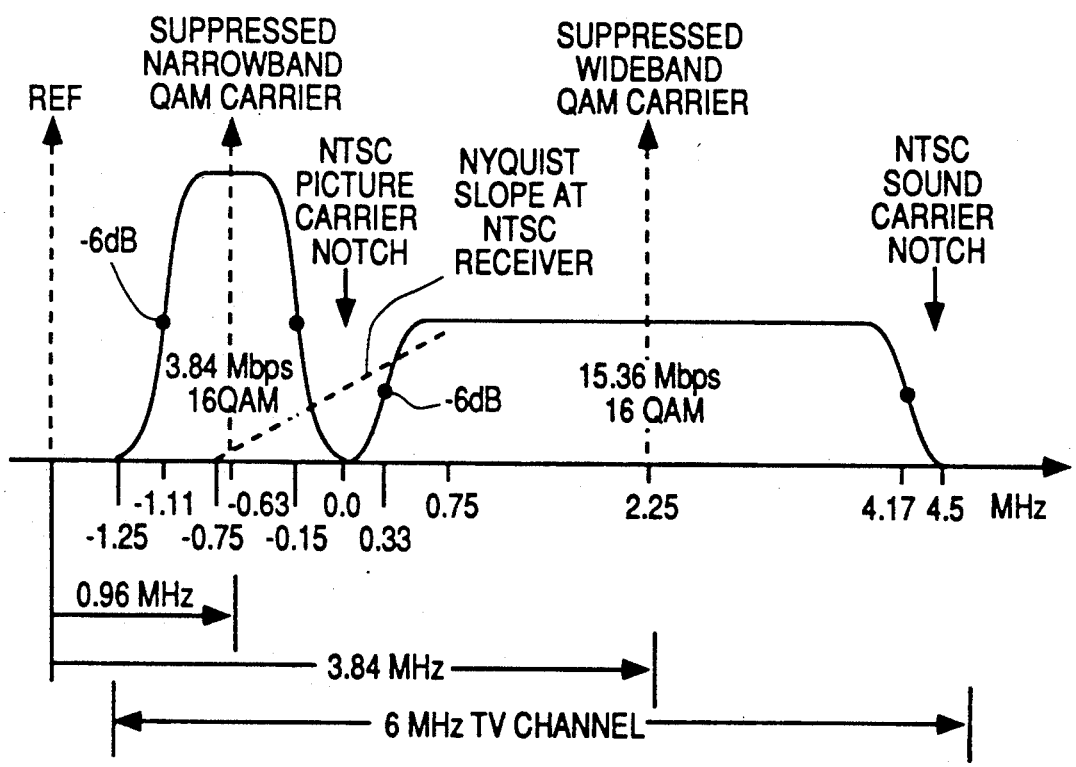
FIG. 2 depicts a baseband video frequency spectrum of a compatible simulcast multiple QAM high definition television signal received and processed by the receiver of FIG. 1.

FIG. 1 illustrates a portion of an HDTV receiver for receiving and digitally processing an HDTV signal of the type shown in FIG. 2. This signal will be described before proceeding with a discussion of the receiver arrangement shown in FIG. 1.

FIG. 2 illustrates the video frequency spectrum of a high definition television signal that is compatible with the 6 MHz bandwidth of a standard NTSC television signal channel, and that can be used as a simulcast signal. The frequencies along the frequency scale of FIG. 2 ($-1.25$ MHz to 4.5 MHz) are referenced to the 0.0 MHz frequency location of the RF picture carrier in a standard NTSC system.

The HDTV television signal is a data compressed signal divided into high and low priority information components. In this example audio, synchronizing and low frequency video information components that are intended to be received with high reliability are assigned a high priority. The synchronizing information, for example, may be in the nature of a training signal containing a unique signature or code to facilitate signal recovery and processing at a receiver, and illustratively may include field rate scanning information (e.g., start of field markers). Other less critical components, such as high frequency video information, are assigned a lower priority. The high priority information exhibits a narrow bandwidth relative to the low priority information, and quadrature amplitude modulates (QAM) a 0.96 MHz first suppressed carrier referenced to a signal REF as discussed below. The low priority information quadrature amplitude modulates a 3.84 MHz second suppressed carrier which is also referenced to signal REF. A resulting composite signal is a form of a multiple QAM signal, i.e., a "twin" QAM signal in this instance. The composite twin QAM signal is translated into the 6 MHz standard television band by means of out-of-band reference signal REF. The frequency of signal REF is chosen so that when signal REF is modulated by the composite QAM signal, one of the resulting sum and difference components falls within the band of frequencies associated with a desired radio frequency television channel, such as simulcast VHF channel 3. Signal REF is modulated by the composite twin QAM signal to produce a double sideband modulated signal, the lower sideband of which is rejected and the upper sideband of which is retained as illustrated by FIG. 2.

The amplitude of the narrowband QAM component is significantly greater than that of the wideband QAM component, twice as large in this example. The −6 db bandwidth of the narrowband QAM component is 0.96 MHz, and the −6 db bandwidth of the wideband QAM component is 3.84 MHz, or four times the bandwidth of the narrowband QAM component. The nonlinear band edge transition regions of the narrowband and wideband QAM components are shaped by finite impulse response (FIR) filters with a square root of a raised cosine characteristic, to produce smooth transition regions which avoid unwanted high frequency effects produced by sharp transition regions. The narrowband component exhibits an amplitude-versus-frequency characteristic with an excess bandwidth of approximately 17%, i.e., 17% more than the theoretical minimum bandwidth defined by the expression $\frac{1}{2} \times 1/T$ where T is the symbol period for the subject signal. The amplitude-versus-frequency response of the wideband component in the band edge transition regions (not drawn to scale) has one quarter the slope of the steeper narrowband component.

The narrowband and wideband QAM components each contain an in-phase component "I" and a quadrature-phase component "Q". The I-phase component modulates a suppressed cosine carrier, and the Q-phase component modulates a suppressed sine carrier. A data "symbol" is represented by both the I component and the Q component. The composite QAM signal is a "16 QAM" signal in this example. Each 16 QAM I and Q component exhibits four discrete amplitude levels, resulting in a total of 4×4 or 16 possible amplitude levels, or values, for each of the narrowband and wideband QAM signals, hence "16" QAM. Two bits are needed to specify the four levels of each I and Q component, whereby each data symbol requires four bits to specify the sixteen levels for an I, Q combination. Thus the bit rate of the 3.84 MHz (−6 db) wideband QAM signal is 15.36 Mbps (3.84 MHz×4 bits), and the bit rate of the 0.96 MHz (−6 db) narrowband QAM signal is 3.84 Mbps (0.96 MHz×4 bits). In a 64 QAM system, the bit rates of the narrowband and wideband components would increase by a factor of 1.5. The described multiple (twin) QAM signal exhibits significant co-channel immunity from interference associated with a standard NTSC television signal, i.e., an NTSC signal transmitted from a different location in the same channel as the twin QAM signal. Co-channel interference from the twin QAM signal into an NTSC signal also is reduced significantly.

The bit rates of the wideband and narrowband QAM signals, 15.36 Mbps and 3.84 Mbps respectively, advantageously exhibit a 4:1 integer relationship. This relationship simplifies recovering the narrowband and wideband QAM information at a receiver, since the same derived data clock can readily be used for timing the data recovery operation of both QAM components. The required data clock rates for the receiver system can be easily derived from the readily recovered high power narrowband QAM signal, as will be discussed.

In the receiver system of FIG. 1, a broadcast twin QAM signal received by an antenna 110 is applied via a tuner 111 to a mixer 112 together with a reference signal REF nominally at the frequency of signal REF used at the transmitter. Tuner 111 includes viewer adjustable apparatus for tuning the receiver from one channel to another in conventional fashion. An output signal from mixer 112 includes sum and difference components. The higher frequency sum component is rejected by a low pass filter 114, which passes the difference component to an analog to digital converter 116. The passed difference component exhibits the composite modulation frequency spectrum shown in FIG. 2, with the narrowband QAM modulation spectrum centered about 0.96 MHz and the wideband QAM modulation spectrum centered about 3.84 MHz.

The digital sampled output signal from unit 116 is applied to a demodulator 118 which, together with elements 120, 122, 124, 126 and 128 forms a narrowband QAM high priority signal processor. Demodulator 118 includes a plurality of input FIR filters for selectively passing the narrowband QAM component, while rejecting the wideband QAM component. Specifically, narrowband QAM demodulator 118 includes a filter having an amplitude versus frequency response characteristic which substantially conforms to the shape of the amplitude versus frequency characteristic of the modulated narrowband QAM component as shown in FIG. 2. The output signal from unit 116 is also applied to a wideband QAM low priority signal processing network 150 which includes elements similar to those found in the narrowband QAM high priority processor, for selectively passing the wideband QAM component while rejecting the narrowband QAM component. Wideband QAM low priority processor 150 includes a demodulator with a filter having a response that substantially conforms to the shape of the amplitude versus frequency characteristic of the modulated wideband QAM component shown in FIG. 2. Thus the receiver system exhibits signal attenuating notches at frequencies associated with high energy information in a standard definition television signal.

Adaptive equalizer 120, of conventional design, receives the demodulated quadrature phased I and Q components from demodulator 118. Equalizer 120 employs an adaptive digital FIR filter to compensate for amplitude and phase irregularities, e.g., including ghosts, caused by the transmission channel. In this example adaptive equalizer 120 is a so-called fractionally spaced equalizer that is capable of sampling over more than the minimum required intervals and therefore introduces whatever phase shift and amplitude changes are needed to produce desired amplitude and phase characteristics for the output I and Q components. Equalizer 120 includes a ROM programmed with desired phase and amplitude values for the I and Q output components of equalizer 120. The output I and Q component values are respectively compared with the programmed values, and the input I, Q values are adjusted to approximate the programmed values based on the results of the comparison. The adjustment is accomplished by changing the tap weights of filters associated with equalizer 120. Equalizer 120 is capable of subsampling within a symbol period to produce the amount of phase and amplitude change needed to produce the desired output amplitude and phase characteristics. As a result of this ability, the operation of equalizer 120 is substantially insensitive to the phase of an applied clock signal, although such phase preferably should be substantially constant. Equalizer 120 may be a synchronous equalizer, although a fractionally spaced equalizer exhibits better performance with respect to the phase characteristics of an applied clock signal. Fractionally spaced and synchronous adaptive equalizers are discussed in the text "Digital Communications", Lee and Messerschmitt (Kluwer Academic Publishers, Boston, Mass., USA, 1988).

Equalized I and Q output signals from unit 120 are applied to an estimator network 126 which produces output I, Q components representing a most likely estimate of the values of I and Q components as transmitted. For example, the values of the I and Q components at the output of estimator 126 have been adjusted as needed to compensate for the distorting effect of noise acquired in the course of transmission. Estimator 126 essentially performs an interpretive function of assigning values to samples which, due to effects such as noise, do not fit exactly into assigned locations in the 16-point four quadrant signal constellation. Output signals from estimator 126 are applied to a decoder 122, which essentially exhibits the inverse of a mapping operation performed by an encoder at the transmitter. Look-up tables are employed to "unmap" the four quadrant signal constellation into the sequential four-bit (symbol) segments, in binary digit form, which existed at the transmitter before being encoded at the transmitter.

An error detector 124 monitors the I, Q input and output signals of estimator 126 for producing a carrier phase error output signal with a magnitude proportional to the phase error between the input and output I and the input and output Q signals of estimator 126. The phase error can be due to noise effects, in which case the phase error would be random in nature. The phase error also can be due to the frequency of signal REF not being substantially equal to the frequency of corresponding signal REF used at the transmitter, in which case the phase error would not be random in nature. An output ERROR signal from error detector 124 ultimately is used to compensate for the frequency of signal REF deviating from a desired value, i.e., the value of the frequency of corresponding signal REF at the transmitter. Error detector 124 operates at a higher sampling rate than equalizer 120, for sensing phase and frequency offsets that may be due to a frequency deviation attributable to synthesizer 135, or to a frequency deviation of an oscillator associated with tuner 111.

Specifically, the ERROR signal is applied to a voltage controlled oscillator (VCO) network 128, including a low pass filter, for modifying the values of quadrature phased sine and cosine reference signals applied to quadrature demodulator 118. The modified sine and cosine reference signals alter the demodulation process until the magnitude of the error representative output signal from detector 124 indicates that any deviation of the frequency of signal REF from a desired value has been compensated. The low pass filter associated with unit 128 filters the ERROR signal so that the values of the reference signals from VCO 128 and thereby the operation of demodulator 118 are modified in response to errors of a non-random nature, such as the described frequency deviation, and are unaffected by random effects such as noise. Wideband QAM low priority signal processor 150 contains elements that operate in the same fashion as units 118, 120, 126, 124 and 128 of the narrowband QAM processor discussed above. Additional information concerning the operation of a control loop of the type including estimator 126, detector 124, VCO 128 and demodulator 118 can be found in the text "Digital Communication", by Lee and Messerschmitt, noted previously.

A signal processor 140 combines the demodulated high priority data signal from decoder 122 and the demodulated low priority data signal from processor 150. Processor 140 may include data decompression networks such as Huffman decoders and inverse quantizers, error correcting networks, and de-multiplexing and signal combining networks for providing separate audio and video television signal components. The audio component is processed by an audio signal processor 142 before being applied to a sound reproducing device 146. The video component is processed by a unit 144 to produce an image representative signal which is applied to an image display device 148.

A direct digital frequency synthesizer 129 produces a 15.36 MHz clock signal CLK in response to a master clock signal from a system clock generator 130, which also provides a clock signal to a frequency synthesizer 135 for developing mixer reference signal REF. The clock signal from generator 130 is used to synchronize the operation of synthesizers 129 and 135, and exhibits a frequency of 10 MHz in this example. The frequency of signal REF nominally corresponds to that of signal REF used at the transmitter. Any deviation of the frequency of signal REF from a desired frequency is compensated for as described above. Signal CLK from source 129 is the clock signal for digital signal processing circuits in low priority processor 150. The high priority narrowband processor processes a signal with a bandwidth that is one-fourth that of the wideband signal. Hence, the high priority processor elements respond to a clock signal CLK/4 with a frequency (3.84 MHz) one-fourth that of signal CLK, as provided by a frequency divider 136.

The frequency of clock signal CLK at the receiver corresponds to the frequency of a clock signal employed at the transmitter. Establishing the proper receiver clock frequency is facilitated by developing the receiver clock signal from information contained in the more reliably received high power narrowband QAM component. Specifically, the composite QAM signal from the output of LPF 114 is applied to a nonlinear signal generator 131, e.g., a power of N generator such as a multiplier that multiplies the input by itself, where N may be 2 or 4. Unit 131 produces a single frequency component at the symbol rate of the narrowband QAM component. In this case the symbol rate is 0.96 MHz, one-quarter of the bit rate. Unit 131 also produces a highly attenuated output component at the symbol rate of the low power wideband QAM component, which output component is ignored by subsequent signal processing units.

The 0.96 MHz symbol rate output component from unit 131 is bandpass filtered by a filter 132 before being applied to a phase shifter 133. Filter 132 has a center frequency at the 0.96 MHz symbol frequency. The bandwidth of filter 132 is not critical, but should be sufficient to provide an adequate signal-to-noise ratio. Phase shifter 133 provides a variable delay of up to one clock period of the 0.96 MHz output signal from filter 132 under conditions which will be described subsequently. Under normal steady-state operating conditions, phase shifter 133 exhibits a static state and imparts an amount of delay to the signal from filter 132 as needed to equalize the phase of the input signals to a phase detector 137.

Under normal steady state conditions an electronic switch 134 is in position "A" as shown. Thus phase detector 137, responsive to the 0.96 MHz symbol rate output component from unit 133, forms a phase locked loop together with a low pass filter 138, synthesizer 129 and a divide-by-16 frequency divider 139. Filter 138 removes spurious frequencies including noise produced by the operation of nonlinear signal generator 133. Frequency divider 139 receives a 15.36 MHz signal from synthesizer 129 and provides a frequency divided 0.96 MHz output signal to a control input of phase detector 137. Synthesizer 129 includes a register which accumulates phase increments determined by the signal applied to a control input of unit 129 from filter 138, at a rate determined by the frequency of the signal from clock generator 130. The accumulated phase value addresses a ROM containing sinusoidal values which synthesize the output signal from unit 129. The function of unit 129 may be implemented with integrated circuit type Q2334 commercially available from Qualcomm Corporation of San Diego, Calif.

In this system the high priority component advantageously exhibits a narrow bandwidth with sharp out-of-band attenuation, i.e., steep "skirts". The small (17%) excess bandwidth of the narrowband QAM component does not allow nonlinear generator 131 to produce an output signal of sufficient magnitude to rapidly develop a properly synchronized clock signal after a system perturbation such as a channel change. Although the narrowband QAM component applied to nonlinear generator 131 exhibits a relatively large amplitude, the small excess bandwidth of the narrowband QAM component prevents generator 131 from developing a large output signal. The magnitude of the output signal from a nonlinear signal generator (e.g., multiplier) such as unit 131 in response to an input QAM signal is a function of the shape of the amplitude versus frequency characteristic of the input signal, particularly at the band edges. For a given passband amplitude characteristic, a steep slope at the band edge produces a small amplitude single frequency output component at the symbol rate of the input signal, whereas a shallow band edge slope produces a large amplitude output component.

The small signal output from nonlinear generator 131 suggests that a narrowband phase locked loop follow generator 131. A narrowband phase locked loop as used in this case exhibits a slow response time compared to a wideband phase locked loop, whereby an output clock signal from the phase locked loop exhibits a slowly varying phase for a period of time until phase lock is achieved. This slowly varying phase prior to phase lock is undesirable since it adversely affects the operation of adaptive equalizer 120 and other clock responsive circuits. Although fractionally spaced equalizer 120 is substantially insensitive to different fixed clock phases, a varying clock phase prior to phase lock can produce tracking problems regarding minimizing the phase error of the I and Q input and output signals and the carrier phase error. Such tracking problems are particularly likely to develop in the interval between the initiation of a channel change and subsequent phase lock, but are avoided by the clock signal generating apparatus discussed below. A varying clock phase during acquisition of a new signal will disrupt or slow down convergence of the equalizer. In particular this condition will occur after a channel change while the equalizer is adapting to compensate the amplitude and phase characteristics of the new channel.

When a channel change occurs, it is desirable to produce a viewable, undistorted image for the new channel quickly because viewers prefer seeing a viewable image almost immediately after a channel change. Thus it is important to quickly develop a suitable clock signal after the disruption of a channel change. This is accomplished by the described apparatus in combination with phase shifter 133, switch 134 and a control network 155. Network 155 is a microprocessor including comparators, switching and logic circuits for providing output control signals as a function of the magnitudes of certain input signals as will be discussed.

Under normal, steady state operating conditions for a given channel, switch 134 is in position A as shown and the phase locked loop including elements 137, 138, 134, 129 and 136 coact to maintain a substantially 0° phase difference between the 0.96 MHz input signal applied to phase detector 137 from phase shifter 133, and the 0.96 MHz input signal applied to phase detector 137 from frequency divider 139. The latter signal is developed by synthesizer 129 in response to a phase error representative control signal from filter 138 conveyed via switch 134 in position A.

When a channel change is initiated by a viewer, tuner 111 provides an output channel change indicator signal CC, e.g., a pulse, to an input of control network 155. Signal CC causes control network 155 to provide an output switching control signal S with a magnitude for causing switch 134 to occupy position B instead of position A. In position B the phase error control signal from the output of filter 138 is switched from synthesizer 129 to phase shifter 133. Synthesizer 129 continues to provide output clock signal CLK with the phase characteristic of the previously tuned channel while control network 155, switch 134 and phase shifter 133 cooperate to align the phase of the output signal from filter 132 for the new channel with the phase of the clock signal associated with the old channel. During this time digital signal processing circuits in the high priority processor and in the low priority processor receive fixed phase clock signals CLK/4 and CLK, respectively.

The phase error representative control signal from filter 138 is applied to a control input of phase shifter 133 via switch 134 in position B for determining the magnitude and direction of the phase shift produced by unit 133. Control network 155 monitors the phase error signal (E) from filter 138 to determine when the action of phase shifter 133 has minimized the phase difference between the signal from synthesizer 129 as conveyed via divider 139, and the phase shifted signal from the newly selected channel as conveyed by filter 132, which acts as a reference signal for phase detector 137. When a minimum is reached, i.e., when the outputs of phase detector 137 and filter 138 indicate a substantially 0° phase difference between the input signals of phase detector 137, control network 155 via signal S returns switch 134 to position A, whereby clock signals developed from the new channel signal are applied to the digital signal processing circuits. At this time phase shifter 133 continues to provide an amount of phase shift (delay) as a function of the last value received from filter 138 and stored by unit 133, whereby the new channel signal from units 132 and 133 acts as a reference for the phase locked loop.

The input of network 155 which receives a reference signal R from the output of filter 132 has associated analog-to-digital converter and comparator circuits, for example. These circuits sense the magnitude of signal R and delay placing switch 134 back in position A until the output signal from filter 132 is large enough to enable the phase locked loop to track the symbol signal of the new channel, from which clock frequency CLK is developed via synthesizer 129. Switch 134 does not return to position A from position B until control network 155 senses that the output signal from filter 132 is large enough for proper phase locked loop operation, and that signal E is representative of a substantially 0° phase difference between the input signals of unit 137.

Thus, after a channel change, a clock signal developed from the previously tuned channel is used as the clock signal for the new channel until the symbol rate component for the new channel as derived by unit 131 can adequately control the phase locked loop and produce a phase-stable clock signal via synthesizer 129. Clock responsive digital signal processing circuits such as the adaptive equalizers exhibit normal, unperturbed operation over the course of a channel change, and receiver functions for the new channel begin immediately after a channel change.

What is claimed is:

1. In a system for processing a high definition television signal, apparatus comprising:
   means for providing a channel change control signal indicative of said system being tuned from a first channel to a second channel;
   digital signal processing means having a signal input for receiving said high definition television signal, and a clock input;
   means responsive to said high definition television signal and to said channel change control signal for developing a clock signal at a clock output, said developing means including means for conveying to said clock output (a) a first clock signal developed from television information associated with said first channel during an initial interval following a channel change, and (b) a second clock signal developed from television information associated with said second channel when said second clock signal exhibits a desired phase characteristic; and
   means for coupling said clock output of said developing means to said clock input of said digital signal processing means.

2. Apparatus according to claim 1, wherein
   said high definition television signal has a bandwidth compatible with a pre-existing standard definition television signal channel, and comprises a narrowband modulated component containing high priority information and a wideband modulated component containing low priority information; and
   said developing means develops said clock signal from said high priority information.

3. Apparatus according to claim 2, wherein said clock signal developing means includes
   means responsive to said high definition television signal for selectively recovering said high priority information;
   frequency synthesizer means having a control input and a signal output;
   phase control means, including a phase control input, responsive to said high priority information and to an output signal from said frequency synthesizer, for developing a phase error representative signal; and
   means for coupling said phase error representative signal to said phase control input of said phase control means during said initial interval, and to said control input of said frequency synthesizer at other times.

4. Apparatus according to claim 3, wherein said coupling means includes
   switch means having an input for receiving said phase error representative signal, a first output coupled to said control input of said frequency synthesizer, and a second output coupled to said phase control input of said phase control means; and
   means responsive to said channel change control signal and to said phase error representative signal for controlling the switching of said switch means between said first and second outputs.

5. Apparatus according to claim 4, wherein
   said control means means for controlling the switching of said switch means is additionally responsive to recovered said high priority information for controlling said switch means.

6. Apparatus according to claim 3, wherein
   said means for selectively recovering said high priority information is a non-linear network.

7. Apparatus according to claim 6, wherein
   said high priority information exhibits an excess bandwidth of less than 30%.

8. Apparatus according to claim 1, wherein
   said digital signal processing means includes an adaptive equalizer responsive to said clock signal from said developing means.

9. Apparatus according to claim 8, wherein
   said adaptive equalizer is a fractionally spaced equalizer.

10. In a system for receiving a high definition television signal having a bandwidth compatible with pre-existing standard definition television signal channel, and comprising a narrowband modulated component containing high priority information and a wideband modulated component containing low priority information, apparatus comprising:
    means for providing a channel change control signal indicative of said receiver being tuned from a first channel to a second channel;
    first digital signal processing means including an adaptive equalizer and having a signal input for receiving said television signal and a clock input, for processing said high priority information;
    second digital signal processing means including an adaptive equalizer and having a signal input for receiving said television signal and a clock input, for processing said low priority information;
    means responsive to said high priority information and to said channel change control signal for developing a clock signal at a clock output, said developing means including means for conveying to said clock output (a) a first clock signal developed from television information associated with said first channel during an initial interval following a channel change, and (b) a second clock signal developed from television information associated with said second channel when said second clock signal exhibits a desired phase characteristic; and
    means for coupling said clock output of said developing means to said clock inputs of said first and second digital signal processing means; wherein said developing means includes
(a) means having a non-linear response for recovering said narrowband high priority information from said television signal;
(b) frequency synthesizer means having a control input and a signal output;
(c) phase control means, including a phase control input, responsive to recovered high priority information from said non-linear means and to an output signal from said frequency synthesizer, for developing a phase error representative signal;
(d) switch means having an input for receiving said phase error representative signal, a first output coupled to said control input of said frequency synthesizer, and a second output coupled to said phase control input of said phase control means; and
(e) control means responsive to said channel change control signal and to said phase error representative signal for controlling the switching of said switch means between said first and second outputs such that said phase error representative signal is coupled to said phase control input of said phase control means during said initial interval, and to said control input of said frequency synthesizer at other times.

11. Apparatus according to claim 10, wherein said narrowband information exhibits an excess bandwidth of less than 30%.

12. Apparatus according to claim 10, wherein said adaptive equalizer included in said first digital signal processing means is a fractionally spaced adaptive equalizer responsive to said clock signal from said developing means.

13. Apparatus according to claim 10, wherein said control means is additionally responsive to recovered high priority information from said non-linear means.

* * * * *